United States Patent [19]

Snyder

[11] Patent Number: 4,788,461
[45] Date of Patent: Nov. 29, 1988

[54] SOLID STATE INDUCTANCE SIMULATOR

[76] Inventor: Gary K. Snyder, 5005 S. Ash Ave., Ste. No. A-19, Tempe, Ariz. 85282

[21] Appl. No.: 1,590

[22] Filed: Jan. 8, 1987

[51] Int. Cl.$^4$ ............................................. H03H 11/48
[52] U.S. Cl. .................................... 307/543; 333/214; 307/299.1
[58] Field of Search ............................ 307/543, 299.1; 333/214

[56] References Cited

U.S. PATENT DOCUMENTS

| | | | |
|---|---|---|---|
| 3,448,411 | 6/1969 | Patterson | 333/214 |
| 3,553,609 | 1/1971 | Edge | 333/214 |
| 4,587,500 | 5/1986 | Tanaka et al. | 333/214 X |

Primary Examiner—John S. Heyman
Attorney, Agent, or Firm—Nissle & Leeds

[57] ABSTRACT

An active choke circuit. The circuit can be used in place of a conventional discrete coil to permit a precise marriage of logic functions to analog functions in a telephone powered by the current in a telephone line.

1 Claim, 1 Drawing Sheet

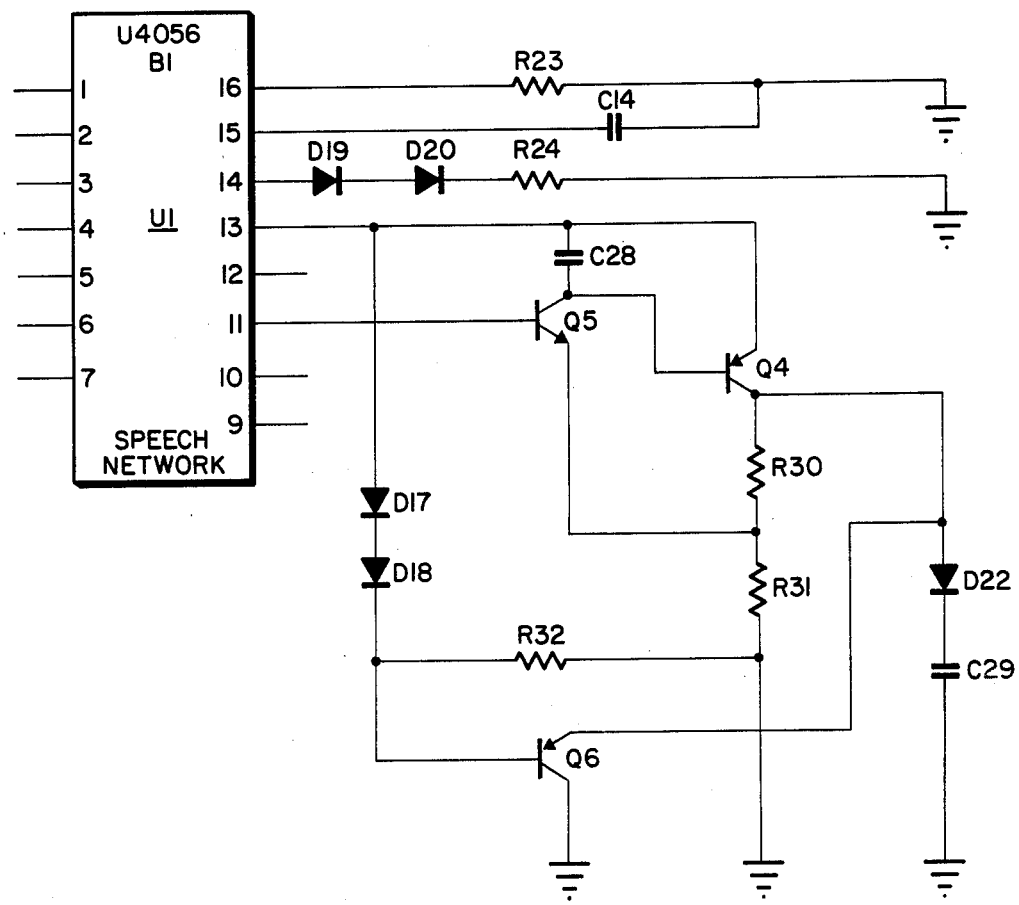

SOLID STATE INDUCTANCE SIMULATOR

This application pertains to a telephone adaptable for operation with a PBS, Key System or Central Office.

More particularly, the invention relates to a non-coin or credit card public telephone which maintains memory on-hook, and is powered by the ten microamp maximum current provided by a telephone line.

In a further respect, the invention pertains to an improved non-coin or credit card telephone which would be adaptable for operation with a PBX, Key System or Central Office and could be continuously powered by commercial telephone lines.

In another respect, the invention pertains to an active choke circuit which can be used in place of a conventional discrete coil to permit a precise marriage of logic functions to analog functions in a telephone powered by the current in a telephone line.

In still a further respect, the invention pertains to an active choke circuit for providing high AC impedance, regulated DC current and a low DC voltage drop.

Specific objects and advantages of the invention will be apparent to those skilled in the art from the following detailed description thereof, taken in conjunction with the drawing, which illustrates the presently preferred embodiment of the invention.

Briefly, in accordance with my invention, I provide an improved active choke circuit for providing a high AC impedance, regulated DC and low DC voltage drop. The circuit includes a DC voltage source; a first transistor having a base connected to a DC voltage source and having an emitter and a collector; a second transistor having a base connected to the collector of the first transistor and having an emitter and a collector; and a third transistor having an emitter connected to the ground, and having a base; at least one diode connected to the base of the third transistor, and connected to a first resistor, the resistor being connected to ground, such that the third transistor is biased when current passes through the diode and the resistor; a second resistor connected to the emitter of the first transistor and connected to the ground; a third resistor connected to the emitter of the first transistor and to the collector of the second transistor; and, a capacitor connected to the base of the second transistor and to the diode. The resistance of the first resistor is high enough to regulate the current bias input to the third transistor. The third transistor provides high AC impedance to current passing through the second transistor. The circuit produces a regulated differential current output at the collector of the second transistor and at the emitter of the third transistor.

Turning now to the drawings, which depict the presently preferred embodiments of the invention for the purpose of illustrating the practice thereof and not by way of limitation of the scope of the invention, and in which like reference characters refer to corresponding elements throughout the several views, the drawing illustrates a choke circuit constructed in accordance with the principles of the invention.

The active choke circuit shown in the drawing is basically a modified current source comprised of Q4, Q5, Q6, D17, D18, C28, R32, R31, R30 and a regulated power supply DC output from pin 11 of the speech network chip U1.

At off hook, the speech network chip U1 in a telephone automatically provides the DC slope parameters for the telephone line current, impedance requirements, 2 to 4 wire conversion, side tone compensation and automatic gain control for signaling in both send and receive at the telephone line. In essence, the speech network is the audio processor which conditions and interfaces all analog signaling of voice and DTMF (dual tone multi frequency). The network chip U1 also provides a precision regulated 1.1 volt DC output at pin 11, which is necessary to bias the active choke circuit.

The purpose of the active choke circuit is to provide a very high AC impedance, regulated DC current and a very low DC voltage drop. High AC impedance is necessary to ensure that audio signaling present at the emitter of Q4 does not pass through the choke circuit and modulate DC current regulated by the active choke which powers all the digital logic circuitry within the telephone.

The theory of operation for the circuit is as follows. When 1.1 volt DC is provided at the base of Q5, Q5 turns on. Resistors R30 and R31 provide a voltage divider and reference to ground for Q5. Collector voltage for Q5 flows through the emitter to the base junction of Q4. Once Q5 is on, current from the divider passes through Q5 to bias the base of Q4. Capacitor C28 provides stability and eliminates spurious oscillations in the circuit. With Q4 on, DC current from the line flows through Q4 referred to ground through the resistor divider path and the high impedance of Q6. Q6 is biased on by current passing through diodes D17 and D18 and resistor R32. R32 resistance is very high and is necessary to regulate the current bias input to Q6 allowing control of current which is taken from the collector current of Q4 and passes through Q6. Q6 allows for negative going transitions in current and also provides additional high AC impedance to current passing through Q4 as referenced to ground. The result of all this is a very well regulated precision differential current output at the collector of Q4 and emitter of Q6. This current can be decreased or increased by changing R30 and R32 resistances. The precision differential current output will automatically adjust the amount of line current required to drive the logic circuitry, which presently is about 6.2 mA. The remaining line current is utilized by the speech network to regulate DC slope parameters, longitudinal balance, AGC and other line criteria. DC voltage potential at the differential output is equivalent to the input voltage present at the line since the saturation voltage of Q4 and Q6 is minimal. Therefore, voltage to the digital logic will vary; however, the current will remain stable. As an example, if the telephone line current is 20 mA, the speech network operates with 13.8 mA while the digital circuitry receives 6.2 mA. If the telephone line current is 100 mA, the speech network operates with 93.9 mA while the logic circuitry is again supplied with 6.2 mA. In each case, voltage to the logical circuitry increases and decreases accordingly. This voltage can be regulated by utilizing C29. C29 is charged through diode 22. The current provided the logic circuitry by the active choke circuitry can automatically increase or decrease on demand to supply minimal circuit needs and to avoid "starving" the analog speech circuitry during low current operation, making this circuit ideal for other applications which require more or less current to a logic array in a line powered design.

The above-described active choke circuit has a high isolation impediment and constant current regulation. When these factors are taken in conjunction with diode D22 and the C dv/dt characteristics of capacitor C29, the digital logic circuits are protected from transient voltages and momentary breaks in telephone line voltage. The active choke circuit also protects digital logic circuit from pulse dialing transient voltages. The telephone must be protected from these types of occurrences to avoid false triggering which can result from parasitic clock inputs. If a conventional discrete coil (choke) were used in place of the active choke circuit the coil would require a very large inductance to achieve equivalent current outputs and would not provide a constant current output to logic circuitry during variations in telephone line current. In addition, the cost of discrete coils is prohibitive and their relatively large size makes installation of the coils awkward. The biggest advantage of the active choke circuit is that it enables all circuitry to be operated by using only telephone line power while complying with the regulations promulgated under Part 68 of FCC Rules and EIA Standard RS-470.

The foregoing information comprises a portion of my application Ser. No. 1,590, filed Jan. 1, 1987, for "LINED POWERED TELEPHONE". The portion of application Ser. No. 1,590 not included herein is hereby directly incorporated by reference thereto. Said application may be requested in its entirety as a publication from Commercial Telephone Group, Inc. (CTG), an Arizona Corporation, of 5025 South Ash Avenue, Suite No. B-10, Tempe, Ariz. 85282.

Having described my invention in such terms as to enable those skilled in the art to understand and practice it, and having identified the presently preferred embodiments thereof, I claim:

1. An active choke circuit for providing a high AC impedance, regulated DC and low DC voltage drop, said circuit including
    (a) a DC input source;
    (b) a first transistor having a base connected to said DC voltage source and having an emitter and a collector;
    (c) a second transistor having a base connected to said collector of said first transistor and having an emitter and a collector;
    (d) a third transistor having an emitter connected to the collector of said second transistor, having a collector connected to ground, and having a base;
    (e) at least one diode
        (i) connected between the base of said third transistor and the emitter of said second transistor, and
        (ii) also connected to a first resistor, said resistor being connected between ground and the base of said third transistor,
        such that third transistor is biased when current passes through said diode and said resistor;
    (f) a second resistor connected to the emitter of said first transistor and connected to ground;
    (g) a third resistor connected to said emitter of said first transistor and to the collector of said second transistor;
    (h) a capacitor connected between the base and emitter of said second transistor and to said diode;
    the resistance of said first resistor regulating the current bias input to said third transistor,
    said circuit producing a regulated differential current output at the collector of said second transistor and at the emitter of said third transistor,
    said base of said second transistor being biased by current from said second and third resistors flowing through said first transistor to said base of said second transistor,
    said base of said third transistor being biased by current passing through said diode and said first resistor, and
    current taken from said collector of said second transistor flowing through said third transistor.

* * * * *